United States Patent [19]

Lowther

[11] Patent Number: 5,157,334
[45] Date of Patent: Oct. 20, 1992

[54] IMAGE INTENSIFIER MONITORING OF POWER LINE INSULATOR LEAKAGE

[75] Inventor: Frank E. Lowther, Plano, Tex.
[73] Assignee: Atlantic Richfield Company, Los Angeles, Calif.
[21] Appl. No.: 468,420
[22] Filed: Jan. 22, 1990
[51] Int. Cl.⁵ .............................................. G01R 31/00
[52] U.S. Cl. .................... 324/501; 250/333; 324/536
[58] Field of Search ............... 324/501, 536; 313/376, 313/381; 250/333

[56] References Cited

U.S. PATENT DOCUMENTS

| | | | |
|---|---|---|---|
| 3,466,537 | 9/1969 | Eigen | 324/501 |
| 3,868,508 | 2/1975 | Lloyd | 250/333 |
| 4,151,415 | 4/1979 | Lipke | 250/333 |
| 4,507,605 | 3/1985 | Geisel | 324/536 |
| 4,775,839 | 10/1988 | Kosina et al. | 324/536 |
| 4,775,853 | 10/1988 | Borruat | 250/339 X |
| 4,980,565 | 12/1990 | Jehle | 250/333 |
| 4,999,577 | 3/1991 | Beha et al. | 324/501 |

FOREIGN PATENT DOCUMENTS 0112973  5/1986  Japan ................................ 324/501

OTHER PUBLICATIONS

IBM Technical Disclosure Nondestructive Infrared Testing of Connections vol. 12, No. 1 Jun. 1969 Jorgensen et al.

*Primary Examiner*—Jack B. Harvey
*Assistant Examiner*—Maura K. Regan
*Attorney, Agent, or Firm*—Albert C. Metrailer

[57] ABSTRACT

A method for detecting incipient flashover of power line insulators by use of an image intensifier to detect electromagnetic radiation generated by electrical leakage. To improve detection sensitivity, a stimulus such as ultraviolet radiation or an externally applied RF pulse is used to momentarily increase insulator leakage to generate detectable electrical leakage at contaminated insulators.

3 Claims, 1 Drawing Sheet

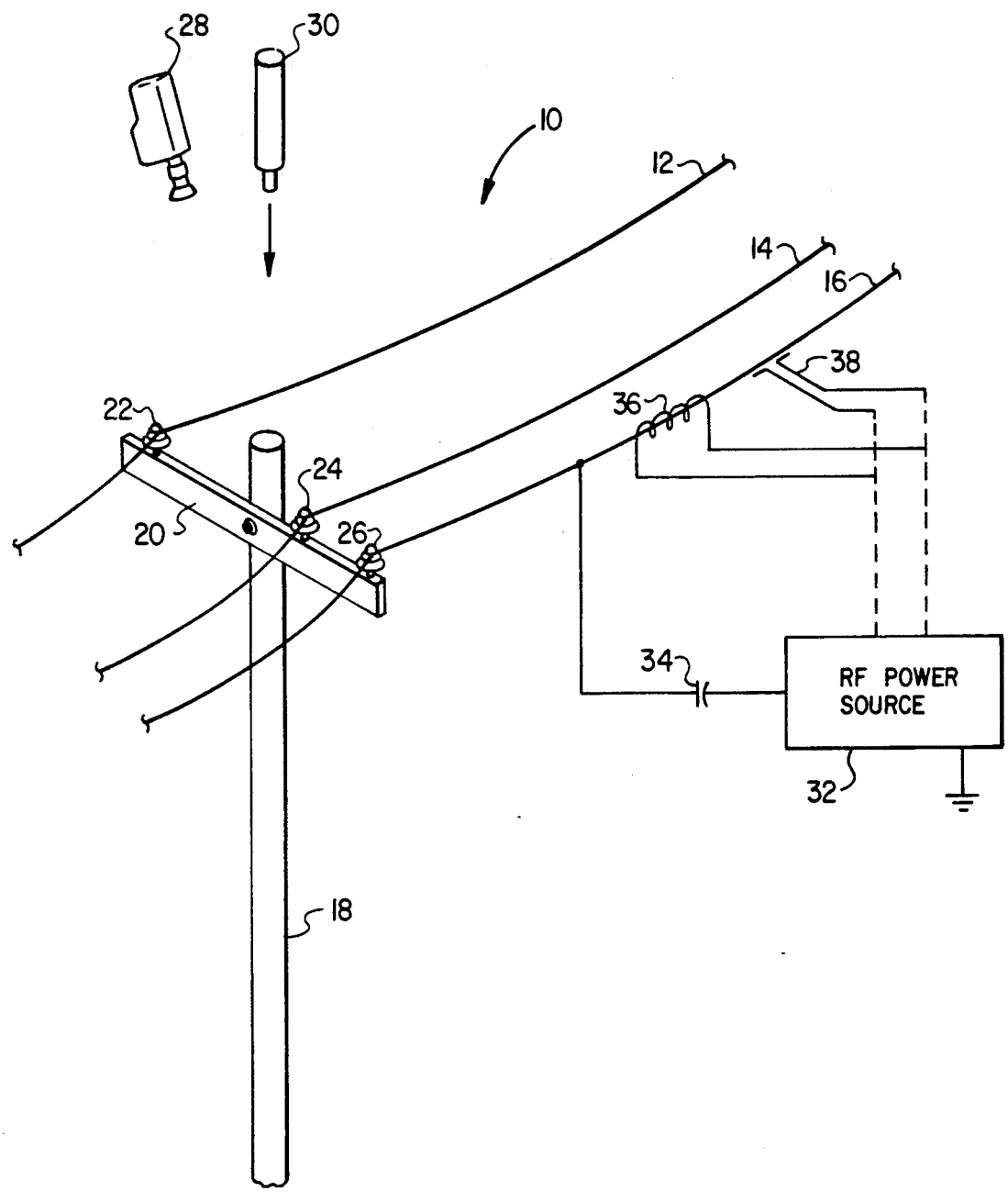

IMAGE INTENSIFIER MONITORING OF POWER LINE INSULATOR LEAKAGE

BACKGROUND OF THE INVENTION

The present invention relates to methods for detecting corona discharge and incipient flashover of power line insulators.

Electrical power lines suffer various types of losses. Conductor resistance losses, commonly referred to as $I^2R$ losses, are often thought to be the major losses. However, electrical leakage of various types at the electrical insulators supporting the power line conductors actually cause losses roughly equivalent to the $I^2R$ losses. Flashover or catastrophic leakage at an insulator will put the power line out of service.

Bulk electrical conduction through modern power line insulators is negligible. Leakage losses generally occur across the surfaces of the insulators. Such surface conduction depends upon surface film characteristics and local electric field conditions. The electric field conditions depend upon atmospheric conditions, line voltage, insulator geometry, amount of corona and density of ion pairs that happen to be present in the immediate gas layer. Foreign substances which may fall on the insulator surface including chemicals such as nitric acid generated by corona discharge itself, can dramatically reduce surface resistance of such insulators.

As surface resistance of an insulator decreases, the surface conduction increases. The ultimate result is flashover which may result in catastrophic failure of the insulator and shutdown of the power line. Flashover conditions normally do not incur instantaneously but instead develop over a period of time as surface contamination occurs. It would be very desirable to provide means for detecting lower levels of surface contamination and leakage so that corrective actions, such as cleaning the insulator, can be taken before destructive flashover conditions occur.

Accordingly, an object of the present invention is to provide a means for detecting incipient flashover of a power line insulator.

Another object of the present invention is to provide means for increasing conduction conditions on a surface of a power line insulator to a detectable but non-catastrophic level.

According to the present invention, an image intensifier night vision system is used to observe insulators in an energized electrical power line to detect corona discharge, other forms of leakage and elevated insulator temperature indicating excessive electrical leakage.

In one embodiment of the present invention, an ultraviolet laser is used to stimulate surface conduction on power line insulators which do not exhibit abnormal electrical leakage under normal operating conditions, whereby a detectable leakage in response to the laser stimulus indicates low level surface contamination and electrical leakage requiring corrective action.

In another embodiment of the invention, a high frequency, high voltage, electrical pulse is applied to an electrical power line while observing its electrical insulators with an image intensifier to observe any increase in leakage resulting from the high frequency pulse stimulus as an indication of low level leakage requiring corrective action.

In another embodiment of the present invention, the power line voltage is increased momentarily, preferably on a repetitive basis, while observing its electrical insulators with an image intensifier whereby detection of electrical leakage in response to this stimulus indicates a low level leakage requiring corrective action.

DESCRIPTION OF THE DRAWINGS

The present invention may be better understood by reading the following detailed description of the preferred embodiments with reference to the accompanying drawing of a section of a electrical power transmission line and equipment for detecting incipient insulator flashover.

DESCRIPTION OF THE PREFERRED EMBODIMENT

With reference to the figure, there is illustrated a section of the electrical power line designated generally, 10. The power line includes three electrical conductors, 12, 14 and 16 typical of a three-phase power transmission system. The electrical conductors 12, 14 and 16 are supported on a pole 18 and cross-arm 20 by means of electrical insulators, 22, 24 and 26. As discussed above, the present invention is directed to identifying leakage across insulators 22-26 by which current is lost from lines 12-16 either to ground or through the supporting structure between the power lines themselves. As used herein, the detection of electrical leakage includes detection of a broad spectrum of electromagnetic radiation generated by any electrical leakage mechanism. These include corona discharge in the atmosphere near conductors 12-16 and near the insulators 22-26. Also included is infrared radiation produced by localized heating of insulators 22-26 and/or the atmosphere near the conductors 12-16 and insulators 22-26.

Also illustrated in the figure is an image intensifier night vision viewer 28. A suitable scanner may be obtained under model number 3000 from B. E. Meyers & Co., Inc., of Redmond, Washington. Scanner 28 provides an optical image which may be observed directly or coupled to still cameras or video systems for real time monitoring or for permanent recording for later review. This type of viewer amplifies available electromagnetic radiation in a spectral window from about 400 nanometers to 980 nanometers. This includes the visible light spectrum of 400 nm to 750 nm and extends into the "invisible" near infrared spectrum, i.e., 750 nm to 980 nm. The system can therefore detect low level corona discharge which is normally invisible due to its low intensity. It can also detect the invisible near infrared radiation resulting from heating of air or insulator surfaces by electrical discharge.

Viewer 28 is illustrated in a position above power line 10 because a preferred method of inspecting the power line 10 is to use a helicopter to fly along the power line right of way allowing rapid and efficient observation of long cross-country power line systems.

As discussed above, surface contamination of power line insulators occurs slowly over time. At very low levels of contamination, electrical leakage may not be easily detected by viewer 28. However, such low levels of leakage cause power losses and, if detected, would indicate that the insulator is approaching a danger condition. I have found that application of a low level stimulus to the surface of insulators 22, 24 and 26 will increase leakage sufficiently to allow viewer 28 to observe the leakage rise if the insulators have low level contamination and are therefore, in a condition of incipient flashover. Uncontaminated insulators will not respond to the stimulus sufficiently to have a detectable leakage. A preferred source of leakage stimulus is an ultraviolet laser as represented by element 30 in figure. Such ultraviolet lasers can generate wavelengths which correspond to 5.2 electron volts which is the oxygen molecular bond energy. Thus, such wavelength can generate an increased number of ion pairs in its path. Since surface conduction and corona discharge are related to the density of ion pairs in the gas layer at the insulator surface, such a stimulus will increase electrical leakage. If insulator surfaces are already contaminated the increase in ion pairs generated by laser 30 will further increase leakage sufficiently to be detectable by viewer 28.

Laser 30 is illustrated positioned above the power line 10. As with the viewer 28, a convenient means for stimulating the power line 10 with laser 30 is to carry it on the helicopter while viewing the power line and intermittently apply the laser beam to insulators which would otherwise be considered safe or uncontaminated. The entire process can be carried out from the air as the helicopter moves along the right of way.

Other sources of leakage stimulation may be used if desired. For example, an RF power source 32 is illustrated connected by capacitor 34 to power line conductor 16. Power source 32 may be used to apply a high voltage, high frequency pulse to the power line. High frequency energy in the radio frequency range tends to generate corona discharge at insulators more easily than the 60 hertz power frequency. Therefore, if insulator 26 is slightly contaminated, an additional stimulus of RF energy bursts will increase the surface conduction generating sufficient leakage to be detectable by viewer 28.

Capacitor 34 is selected to prevent coupling of the 60 hertz power line voltage back to the RF power source 32 but to allow efficient coupling of RF energy from source 32 to power line 16. While the RF signal will travel along power line 16 for a considerable distance, it should not affect loads which are attached to the power line through typical step-down transformers. The inductance of such transformers will normally prevent the RF signal from passing through to such loads.

Alternatively, the RF power source may be coupled to the power line by other means. For example, an inductive loop 36 or a dipole antenna 38 may be used.

Another form of leakage stimulus would be a momentary increase in power line voltage. Such a stimulus would be repeated to allow detection of leakage pulses at insulators which appear safe but are approaching a dangerous leakage condition. Certain loads which might be damaged by the line voltage increases would have to be disconnected from the system during this type of testing. Many loads however would not be damaged if the duty cycle of the voltage increase is kept low.

Operation of the present invention is quite simple. In the first embodiment, viewer 28 is carried along power line 10, preferably by means of a helicopter and used to observe insulators such as insulators 22, 24 and 26. Any insulator exhibiting electrical leakage is considered contaminated and should be cleaned by well-known means. Typically, such insulators may be washed by liquid spray from a helicopter.

As to insulators which do not appear to be contaminated by simple inspection with viewer 28, a stimulus is applied to determine whether low levels of contamination or incipient flashover is present. Laser 30 may be used to apply pulses of ultraviolet light to an insulator such as insulator 24 while observing through viewer 28. If a noticeable leakage is observed, incipient flashover is indicated and the insulator needs to be cleaned. I anticipate that defocussing of laser 30 sufficiently to allow illumination of a number of insulators on a given supporting structure 18, for example all of the insulators 22, 24 and 26, will allow sufficient stimulation but improved efficiency of the process.

Alternatively, the RF power source 32 may be connected to the power line and applied, possibly by remote control from a helicopter, to stimulate a number of insulators along the power line 10. Alternatively the power line voltage may be increased on a low duty cycle basis. In these processes it is preferable to position viewer 28 to observe the power line 10 on a low angle so that a number of insulators may be observed along the lines simultaneously. This would again improve the speed and efficiency of insulator inspection.

While the present invention has been illustrated and described with reference to specific apparatus and methods of use, it is apparent that various modifications may be made therein within the scope of the appended claims.

What is claimed is:

1. A method for detecting incipient flashover of a power line insulator comprising:
   using an image intensifier to observe an electrical insulator in an energized power line, and
   while observing said insulator, illuminating said electrical insulator with an ultraviolet laser beam, whereby generation of detectable electromagnetic radiation from the insulator in response to said illumination indicates incipient flashover.

2. A method for detecting incipient flashover of a power line insulator comprising:
   using an image intensifier to observe an electrical insulator in an energized power line, and
   while observing said insulator, applying a high frequency high voltage pulse to said power line, whereby an increase in detectable electromagnetic radiation from the insulator in response to said pulse indicates incipient flashover.

3. A method for detecting incipient flashover of a power line insulator comprising:
   using an image intensifier to observe an electrical insulator in an energized power line, and
   while observing said insulator, momentarily increasing line voltage, whereby an increase in detectable electromagnetic radiation from the insulator in response to said voltage increase indicates incipient flashover.

* * * * *